United States Patent [19]
Chakrabarti et al.

[11] Patent Number: 5,802,091
[45] Date of Patent: Sep. 1, 1998

[54] TANTALUM-ALUMINUM OXIDE COATINGS FOR SEMICONDUCTOR DEVICES

[75] Inventors: Utpal Kumar Chakrabarti, Allentown, Pa.; William Henry Grodkiewicz, Glen Gardner; Ping Wu, Berkeley Heights, both of N.J.

[73] Assignee: Lucent Technologies Inc., Murray Hill, N.J.

[21] Appl. No.: 758,630

[22] Filed: Nov. 27, 1996

[51] Int. Cl.⁶ ............................................. H01S 3/19
[52] U.S. Cl. ............................................. 372/49
[58] Field of Search ........................... 372/49, 44, 109, 372/33; 257/98, 100, 787

[56] References Cited

U.S. PATENT DOCUMENTS 4,372,987  2/1983  Ganner et al. .................... 427/42
4,749,255  6/1988  Chakrabarti et al. ............. 350/164
5,144,635  9/1992  Suhara ................................ 372/49

OTHER PUBLICATIONS

Medium–Index Mixed Oxide Layers for Use in AR–Coatings, *SPIE*, vol. 662, Thin Film Technologies (1986) Peter Ganner, pp. 69–76 (No Month).

*Primary Examiner*—James W. Davie
*Attorney, Agent, or Firm*—Lester H. Birnbaum

[57] ABSTRACT

An active semiconductor device includes a coating comprising an oxide of tantalum and aluminum. The coating may function as an AR coating or as a passivation coating. Applications to ICs and optical devices are described.

13 Claims, 2 Drawing Sheets

TANTALUM-ALUMINUM OXIDE COATINGS FOR SEMICONDUCTOR DEVICES

BACKGROUND OF THE INVENTION

This invention relates to coatings for semiconductor devices, and, more particularly, to antireflection and/or passivation coatings for semiconductor active devices.

Dielectric coatings, layers, regions, and the like serve many purposes in semiconductor devices. For example, they may perform an insulating function to restrict the contact area of electrodes or to electrically isolate one layer of an integrated circuit (IC) from another. Alternatively, they may perform reflection-modifying functions to facilitate the use of photolithograhpy in the fabrication of IC's or to enhance the performance of semiconductor active optical devices such as LEDs, lasers, and photodetectors. Thus, low reflection (e.g., 1–5% reflectivity) coatings have been used on the output facet of Fabry-Perot lasers to increase their quantum efficiency, and anti-reflection (e.g., <1% reflectivity) coatings have been used on the output facet of a distributed feedback (DFB) laser to suppress Fabry-Perot modes and induce single longitudinal mode emission. In addition, dielectric coatings have also been used to passivate semiconductor active devices, especially ICs and active optical devices; e.g., to act as a barrier to contamination, to prevent oxidation of the protected surface, or to prevent evaporation of elements therefrom. Of course, it is sometimes the case that a single coating may serve multiple functions such as both passivation and reflection-modification.

The dual function coating has become particularly important of late in the design of non-hermetic semiconductor lasers; that is, lasers that are not housed in a hermetic package. Under such circumstances it is important that the coating not only provide the reflection-modification function from a performance standpoint but also a passivation function from a reliability standpoint. Without a hermetic package the laser is more likely to be subject to degradation from contaminants in its operating environment. Of particular concern is the impact of moisture (or water vapor) on the laser's reliability.

The suitability of a coating material to perform the above functions depends, in part, on the ability to deposit, or otherwise form, the coating with low reflectivity (typically as close to zero as possible) at the operating wavelength of the optical device (e.g., at the emission wavelength of a laser or LED; at the detection or received wavelength of a photodetector). Thus, a coating that performs the desired passivation or reflection-modification functions on one device may fail to do so adequately on another very similar device. As an illustration, an anti-reflection (AR) coating designed for the output facet of an InP-InGaAsP DFB laser which has an effective refractive index ($n_{eff}$) of, say, 3.6 (indicative of a relatively high proportion of the higher index quaternary material) may not be suitable for use on an InP-InGaAsP MQW laser in which the output facet has an $n_{eff}$ of, say, 3.1 (indicative of a higher proportion of the lower index binary material). Likewise, a coating designed for use on a passive optical device (e.g., a glass lens) does not need to perform passivation, and therefore provides little direction to solving the more complex contamination problems inherent in the design of an active semiconductor device. See, P. Ganner et al., U.S. Pat. No. 4,372,987 issued on Feb. 8, 1983, for a discussion of multilayered AR coatings on glass objects such as lenses.

SUMMARY OF THE INVENTION

In accordance with one aspect of our invention, an active semiconductor device includes a coating which comprises an oxide of tantalum and aluminum. The active device illustratively comprises an IC, or an optical device such as a laser, LED or photodiode.

In the case of an IC, the tantalum-aluminum oxide coating serves as a barrier disposed between an active region of the IC and a source of contamination such as moisture.

In the case of a semiconductor laser, the tantalum-aluminum oxide coating is formed as a single layer on the laser facet and is designed to function both as a reflection-modification and a passivation coating. In a preferred laser embodiment, the coating is sufficiently dense and stable to enable the laser to operate reliably in a non-hermetic environment.

In accordance with another aspect of our invention, the tantalum-aluminum oxide coating is fabricated by an ion-assisted, e-beam deposition technique in which the device samples and the ion and evaporant beams are rotated relative to one another so that the evaporant is incident on the samples at all times during deposition, but the ions are incident on the samples only part of the time. Yet another aspect of our invention is that the crucible of the e-beam apparatus is filled using a repeated two-step procedure; that is, the crucible is partially filled with source material, and then the source material is premelted. These two steps are repeated until the crucible is essentially full. This fabrication technique produces dense oxides which are highly impervious to moisture and highly reproducible.

BRIEF DESCRIPTION OF THE DRAWINGS

Our invention, together with its various features and advantages, can be readily understood from the following more detailed description taken in conjunction with the accompanying drawing in which.

In the interest of clarity, the figures have not been drawn to scale.

DETAILED DESCRIPTION

Figure 1:
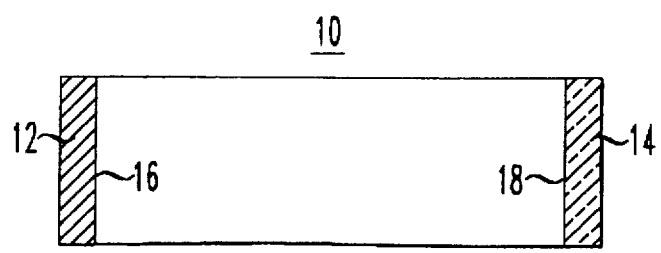
FIG. 1 is a schematic view of a semiconductor device in accordance with one aspect of our invention.

Turning now to FIG. 1, there is shown an active semiconductor device 10 (or a portion thereof) which, by way of example, may be an IC, a laser, an LED or a photodetector. Device 10 may have one or more dielectric coatings 12, 14, formed on one or more surfaces, or facets 16, 18. The coatings 12, 14 may serve to alter the reflectivity of the surfaces, to passivate them, or both. Illustratively, device 10 comprises a compound semiconductor material such as a Group III—V or Group II–VI compound material. Alternatively, device 10 may comprise an elemental semiconductor, such as Si, or a complex, multilayered structure including semiconductor, dielectric and metallic materials (as in the case of a Si IC). For purposes of exposition, and without limitation, we will describe device 10 hereinafter as an InP-InGaAsP multi-quantum well (MQW) distributed feedback (DFB) laser in which case one of the coatings is a high reflectivity (HR) coating 12 and the other is a low reflectivity or anti-reflection (AR) coating 14.

Figure 2:
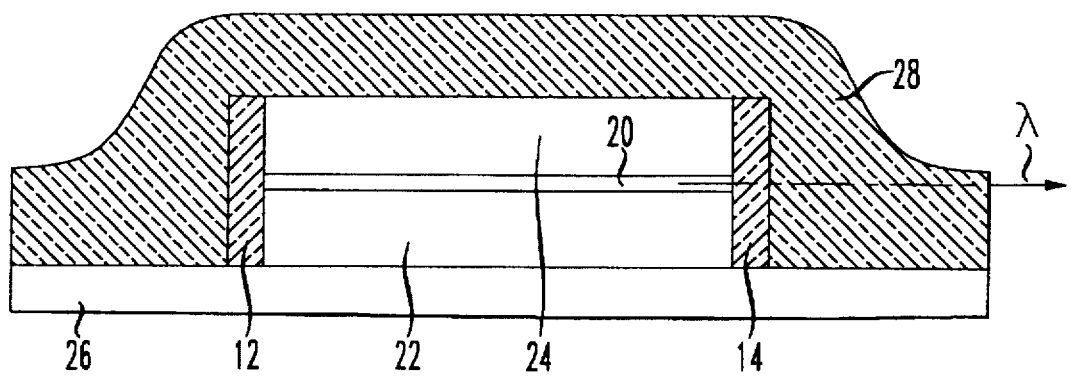
FIG. 2 is a schematic, cross-sectional side view of an encapsulated, non-hermetic semiconductor laser in accordance with another embodiment of our invention.
Figure 3:
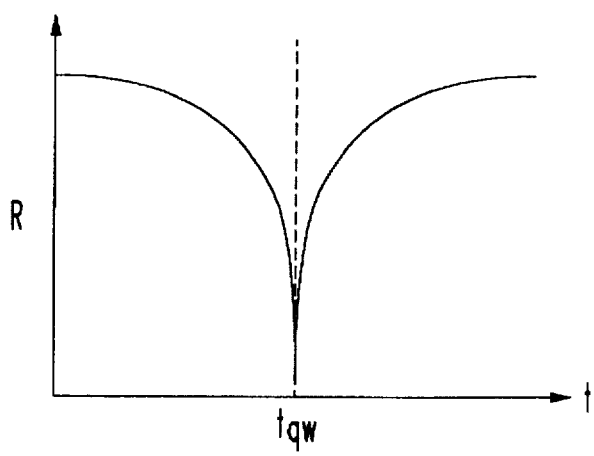
FIG. 3 is a graph of the reflectivity versus thickness of a single-layer AR coating illustrating symmetry about the quarter wave thickness $t_{qw}$.

A schematic illustration of such a laser is shown in FIG. 2 where elements corresponding to those of FIG. 1 have been given like reference numbers. The laser is mounted on a support member 24 and embedded in an encapsulation material 28 (e.g., a polymer such as an epoxy). This type of encapsulation is used in non-hermetic packages preferred for low cost applications. The basic laser structure is well known in the art; it comprises an MQW active region 20 disposed between a pair of wider bandgap InP cladding regions 22 and 24. The details of region 20, as well as the DFB gratings, have been omitted for simplicity. Both are well known to those skilled in the art. An HR coating 12 is formed on one laser facet, and an AR coating 14 is formed on the other. Not shown, but also well known, are electrical contacts used to provide forward bias and sufficient drive current to cause the active region to emit radiation $\lambda$ primarily through the AR coating 14 and polymer 28 to a utilization device not shown (e.g., an optical fiber, a photo-detector etc.). Some radiation may also emerge from HR coating 12, and as is conventional in the art, this "back-face" emission may be directed to a monitor photodiode (not shown) used to control certain aspects of laser operation (e.g., its bias or operating point).

In accordance with one aspect of our invention, the AR coating 14 is a single layer comprising an oxide of tantalum and aluminum. The chemical formula for the oxide may be written as $(Al_2O_3)_x(Ta_2O_5)_{1-x}$ where x is the mole fraction of $Al_2O_3$ in the layer. By varying x one can vary the refractive index $n_{ox}$ of the oxide. Thus, for x=1.00 (essentially no tantalum oxide), 0.90, 0.80 and 0.75, $n_{ox} \cong 1.56$, 1.73, 1.78, 1.80, respectively, over a wavelength range of about 1.3 μm to 1.55 μm (typical emission wavelengths of InP-InGaAsP lasers). At the opposite extreme, x≅0, representing essentially no aluminum oxide, $n_{ox} \cong 2.1$ over the same wavelength range. From a stability standpoint, in a moist environment, the parameter x should be in the range 0<x≦0.80. Above x=0.80 the oxide layers may not be sufficiently stable for non-hermetic applications.

To function properly as a single-layer AR coating the thickness t of the coating should correspond to the quarter wave thickness $t_{qw}=\lambda/4n$, where $\lambda$ is the wavelength of the laser emission as measured in a vacuum, and n is the refractive index of the coating (i.e., $n=n_{ox}$ above). The latter in turn should satisfy the relationship $n_{ox}=\sqrt{+e,fra\ n+hd\ eff+ee\ }$, where $n_{eff}$ is the effective refractive index of the surface on which the coating is formed. In this embodiment the surface is a laser facet formed by the edges of multiple layers of InP and InGaAsP. Thus, $n_{eff}$ is essentially an average of the refractive indices of the layers penetrated by the transverse mode of the laser radiation. In many InP-InGaAsP MQW designs $n_{eff}$ ranges from about 3.1 to 3.3, with $n_{eff} \cong 3.17$ being typical for 1.55 μm lasers and $n_{eff} \cong 3.24$ for 1.3 μm lasers. Therefore, $n_{ox}=\sqrt{n_{eff}}$ is typically about 1.78–1.80, which is obtained in a tantalum-aluminum oxide coating with x≅0.80–0.75.

In applications where the laser radiation propagates through the AR coating into air (typical of hermetic packages) the above calculations are accurate. However, where, as in FIG. 2, the laser radiates into another medium, such as the encapsulation material 28, then the equation $n_{ox}=\sqrt{n_{eff}}$ should be adjusted to take into account the refractive index $n_{enc}$ of the encapsulating material (e.g., about 1.30 to 1.39 for illustrative epoxies); i.e., $n_{ox}=\sqrt{n_{eff}n_{enc}}$. In such cases, a higher refractive index AR coating would be called for by the modified equation for $n_{ox}$ which would in turn mean a higher proportion of tantalum oxide (i.e., lower value of x) would be used in the coating.

Figure 4:
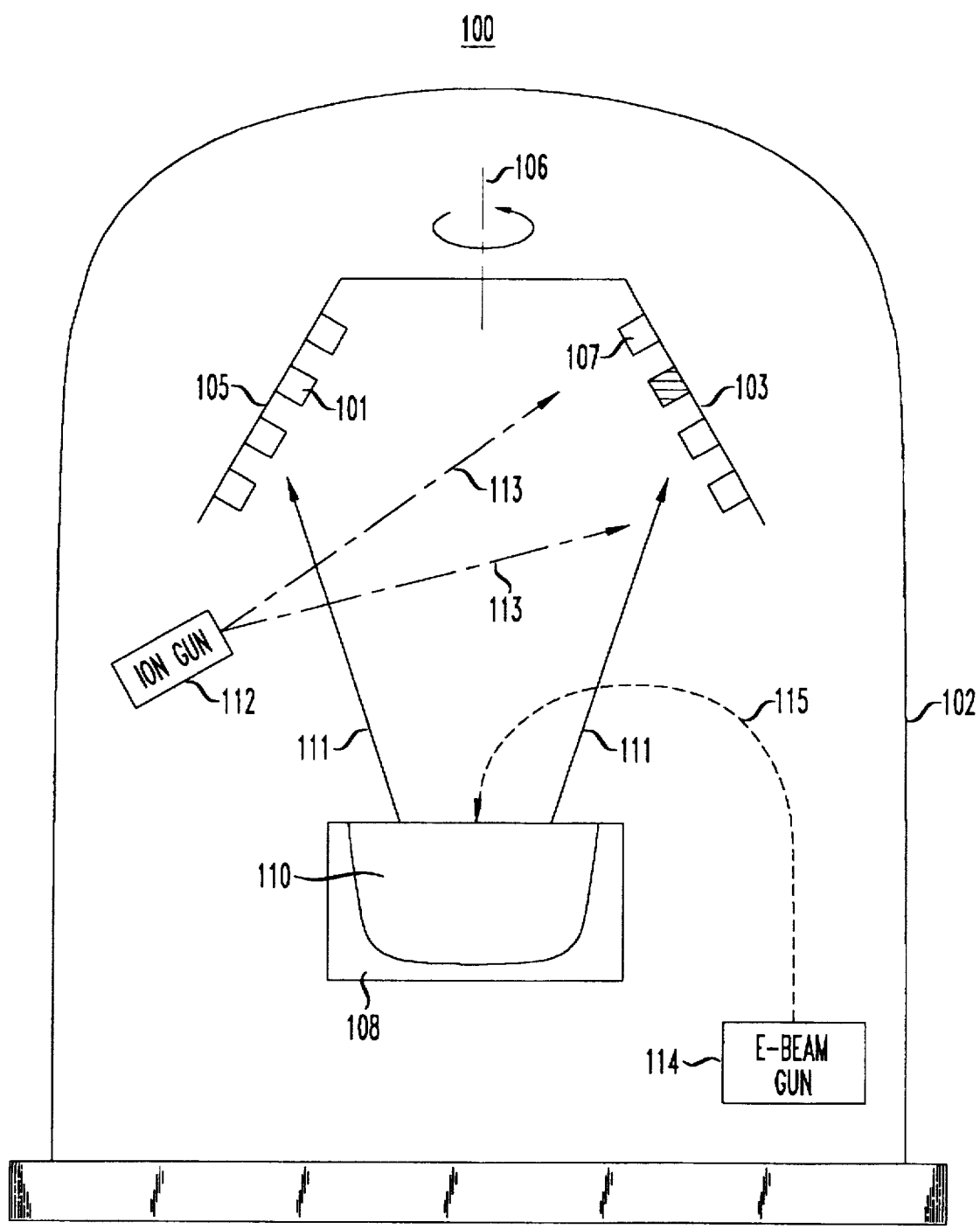
FIG. 4 is a schematic of e-beam deposition apparatus used to form a dielectric (e.g., tantalum-aluminum oxide) coating on the surface of the device of FIG. 1 in accordance with yet another embodiment of our invention.

In accordance with another aspect of our invention, tantalum-aluminum oxide-coatings are fabricated by a pulsed ion-assisted, e-beam deposition technique. FIG. 4 is a schematic of illustrative apparatus 100 used in such a fabrication process. The apparatus comprises a vacuum chamber 102 in which are disposed: a sample holder 104 which is rotable about an axis 106, a crucible 108 for carrying a source material 110, an ion gun 112, and an e-beam gun 114.

Holder 104 has oblique panels 103, 105 on which samples 101, 107 are mounted. Two panels with four samples each are shown for purposes of illustration only. The samples are illustratively individual semiconductor chips or elongated bars of chips which haven't been separated from one another (in the latter case FIG. 4 would depict such bars end-on).

The source material 110 is heated by an e-beam 115 from gun 114 to a sufficiently high temperature to evaporate the source material. The evaporated material forms a beam 111 which is incident on the samples 101, 107 at all times. In contrast, the ion gun 112 generates an ion beam 113 which, in the position shown, is incident on samples 107 but not on samples 101. However, as the holder rotates, the ion beam is incident on samples 101 but not on 107. In this fashion, the samples "see" the ion beam for only a fraction of the cycle time (defined by the rotation speed of the holder). Viewed another way, the ion beam is effectively pulsed. Other techniques for pulsing the ion-beam are also contemplated within the scope of this aspect of our invention; e.g., shuttering the ion gun 112 at a suitable rate (with or without rotation of sample holder 104).

In accordance with another aspect of our invention, the reproducibility (e.g., of the refractive index) of the coatings is improved by filling the crucible 108 with source material 110 in stages; i.e., by repeating a two-step sequence of partially filling the crucible and then premelting the source material. More specifically, the tantalum-aluminum oxide source material is prepared in granular form by a well known process of ball melting a mixture of tantalum oxide and aluminum oxide in requisite proportion and then sintering the mixture.

A first quantity (e.g., by weight) of source material is placed in the crucible. The first quantity, which is insufficient to fill the crucible, is then melted (e.g., by heating it to around 2200° C., illustratively by means of the e-beam 115). After the melted source material cools, a second quantity of source material is added to the first quantity. The first and second quantities may be equal to one another, or may be different. Both quantities are likewise heated and melted using the e-beam. This sequence is repeated until the crucible is full or nearly full. The number of repetitions depends on the size of the crucible and the size of quantities and can be easily be determined by those skilled in the art. One object of this approach is to reduce the shadowing effect caused by the top edges of the crucible; i.e., if the crucible is simply filled in a single step with granular material without using the sequential filling process described above, the top surface tends to sink causing the evaporant beam to be partially blocked by the edges of the crucible. This shadowing effect causes nonuniformity in the thickness of the coatings deposited on the samples.

Of particular interest is the application of these fabrication techniques to the deposition of coatings of $(Al_2O_3)_x(Ta_2O_5)_{1-x}$ from a melted mixture of granular $Al_2O_3$ and granular $Ta_2O_5$. An important feature of this source material is that it evaporates congruently when heated by an e-beam. This characteristic means that as the upper-most surface of the source material is depleted, the composition (e.g., the ratio of $Al_2O_3$ to $Ta_2O_5$) in the remainder does not change significantly, if at all. Thus, the remaining source material can be reused rather than discarded.

EXAMPLE I

Using the above fabrication technique, we have deposited coatings of $(Al_2O_3)_x(Ta_2O_5)_{1-x}$ with $0 \leq x \leq 1.0$ on a variety of substrates including InP, GaAs, InGaAsP (as well as complex multi-layered facets of two or more of the foregoing materials), glass and Si.

In commercially available deposition equipment, we used e-beam voltages of about 7 kV, but 5–10 kV is suitable. We also used an ion gun voltage of 500 V with 300–700 V being suitable and an ion beam current of 35 mA with 35–100 mA being suitable. The ion species were Ar ions, although $O_2$, Xe, Ne or other ions may also be suitable. The pressure in the vacuum chamber 102 was typically $1 \times 10^{-5}$ torr to $1 \times 10^{-4}$ torr, although pressures outside this range may also be used. Under these conditions, the deposition rate of 2–10 Å/s is readily achievable, with 2–8 Å/s being typical, and coatings of essentially any desired thickness can be obtained. For example, we have deposited layers of 1000–3000 Å thickness at different deposition rates ranging from 2 to 4 Å/s.

The refractive index $n_{ox}$ of the coatings, as mentioned earlier, was varied by changing the composition (x) of the oxide; e.g., for x=1.00, 0.90, 0.80, 0.75, then $n_{ox} \approx 1.56, 1.73, 1.78, 1.80$, respectively.

These layers may serve as single layer AR coatings (reflectivity <<1.0%), as low reflectivity (LR) coatings (reflectivity in the range of about 1–10%), or as passivation coatings. In the latter case, if it is desirable not to change the reflectivity of the underlying surface on which the coating is deposited, then the coating thickness should be $2t_{qw}$. As noted earlier, for stability in the presence of moisture, it is preferable that $0 < x \leq 0.80$.

EXAMPLE II

The following example illustrates how the inventive concepts described above have been applied to depositing tantalum-aluminum oxide AR coatings on the output facets of InP-InGaAsP MQW DFB lasers. The laser operating wavelength was about 1.3 μm, and the effective refractive index of the output facet was about 3.24.

A single layer AR coating of $(Al_2O_3)_{0.8}(Ta_2O_5)_{0.2}$ was deposited on the output facet of each laser. The refractive index of the coatings was $n_{ox} \approx 1.80$, and their thickness was about 1800 Å (equal to the quarter wave thickness at $\lambda \approx 1.3$ μm). Note, for a laser operating at, say, 1.55 μm ($n_{eff} \approx 3.17$), than $n_{ox} \approx 1.78$. Moreover, if the lasers had been encapsulated in a polymer, the corresponding $n_{ox}$ would be higher.

In order to evaluate their performance, we subjected the coatings to conditions that were significantly more harsh than they would experience in a typical non-hermetic operating environment, knowing that if the coatings passed the harsher tests, they would have a high likelihood of being suitable for the intended non-hermetic applications. Thus, the coatings (deposited on InP substrates, not on laser facets) were first tested by immersing them in hot water (96°–99° C.) for 1000 hours. No change in coating thickness or refractive index was observed. Then similar coatings on laser facets (of 1.3 μm lasers as described above) were stress tested under conditions of 85° C./85% relative humidity and 35 mA of drive current for in excess of 1000 hours. No degradation of laser operation was observed. Finally, the moisture barrier properties of these coatings were evaluated by using an Elastic Recoil Detection technique in which the coatings (deposited on Si substrates) were immersed in hot water (96°–99° C.) for 500 hours. We observed that hydrogen was confined to the surface of the coating, i.e., no hydrogen was detected in the bulk of the coating which means that the coating is an effective barrier against moisture penetration into the underlying substrate. Thus, the coating would also be an effective moisture barrier for an active device formed in such a substrate. Likewise we expect the efficacy of the coating in this regard to apply to devices formed in/on substrates of Si, Group III–V compounds, and Group II–VI compounds.

In summary, these examples demonstrate that we have been able to fabricate reproducible, stable single-layer AR coatings on InP-InGaAsP laser facets, and that the coatings sufficiently passivate the facets to enable the lasers to be operated in a non-hermetic environment.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention. In particular, although the above fabrication processes are the preferred methods of practicing the invention, especially for depositing laser facet coatings, other deposition techniques may also be suitable for other applications in other devices. For example, where reduced throughput can be tolerated, rf sputtering or ion beam sputtering may be suitable.

The invention claimed is:

1. An active optical device comprising:
   an active region of semiconductor material,
   a coating disposed over said region, and
   a medium adjacent said coating and through which optical radiation propagates, characterized in that
   said coating comprises a single layer of an oxide of tantalum and aluminum.

2. The device of claim 1 wherein said region includes an active region of said device.

3. The device of claim 1 wherein said region comprises Group III–V compound material having an effective refractive index between about 2.0 and 4.0.

4. The device of claim 3 wherein said coating has a thickness substantially equal to $\lambda/4n_{ox}$, where $n_{ox}$ the refractive index of said coating, is substantially equal to $\sqrt{n_{eff} n_{enc}}$, where $n_{eff}$ is the refractive index of said region and $n_{enc}$ is the refractive index of said medium.

5. The device of claim 4 for use as a laser wherein said medium comprises an epoxy which encapsulates said device.

6. The device of claim 5 wherein said region comprises a surface formed by the edges of a plurality of InP and InGaAsP layers.

7. The device of any one of claims 1 to 6 wherein said coating comprises $(Al_2O_3)_x(Ta_2O_5)_{1-x}$ and $0 < x \leq 0.8$.

8. A non-hermetic semiconductor laser capable of emitting radiation at a wavelength $\lambda$, said laser comprising
   an output facet formed by the edges of a plurality of InP and InGaAsP layers and having an effective refractive index $n_{eff}$,
   an antireflection coating formed on said facet, an encapsulant in which said laser is embedded and a portion of which is disposed adjacent said facet, said encapsulant having a refractive index $n_{enc}$, characterized in that said coating comprises a single-layer of $(Al_2O_3)_x(Ta_2O_5)_{1-x}$ wherein x is selected to produce a refractive index $n_{ox}$ substantially equal to $\sqrt{n_{eff}n_{enc}}$, and the thickness of said coating is substantially equal to $\lambda/4n_{ox}$.

9. The laser of claim 8 wherein $0 < x \leq 0.8$.

10. The laser of claim 9 wherein $\lambda \cong 1.3-1.55$ µm, $n_{eff} \cong 3.1-3.3$, and $x \cong 0.7-0.8$.

11. An integrated circuit comprising a region of semiconductor material including an active device, a barrier region disposed between said active device and a source of contamination, characterized in that said barrier region comprises an oxide of tantalum and aluminum.

12. The circuit of claim 11 wherein said contamination includes moisture and said oxide barrier region is effective to prevent any significant amount of moisture from reaching said active device.

13. The device of claim 12 wherein said material comprises $(Al_2O_3)_x(Ta_2O_5)_{1-x}$ and $0 < x \cong 0.8$.

* * * * *